US008013505B2

(12) United States Patent
Wei et al.

(10) Patent No.: US 8,013,505 B2
(45) Date of Patent: Sep. 6, 2011

(54) FIELD EMISSION ELECTRON SOURCE HAVING A CARBON NANOTUBE NEEDLE

(75) Inventors: Yang Wei, Beijing (CN); Liang Liu, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 241 days.

(21) Appl. No.: 12/313,932

(22) Filed: Nov. 26, 2008

(65) Prior Publication Data

US 2009/0236961 A1 Sep. 24, 2009

(30) Foreign Application Priority Data

Mar. 19, 2008 (CN) .......................... 2008 1 0066123

(51) Int. Cl.
*H01L 21/00* (2006.01)
*H01J 1/02* (2006.01)
*H01J 9/00* (2006.01)

(52) U.S. Cl. ........ 313/311; 313/336; 313/351; 313/310; 445/23; 445/24

(58) Field of Classification Search ........................ None
See application file for complete search history.

(56) References Cited

U.S. PATENT DOCUMENTS

| | | | | |
|---|---|---|---|---|
| 6,232,706 | B1 * | 5/2001 | Dai et al. | 313/309 |
| 6,504,292 | B1 * | 1/2003 | Choi et al. | 313/310 |
| 7,064,474 | B2 | 6/2006 | Liu et al. | |
| 2003/0143356 | A1 * | 7/2003 | Morikawa | 428/36.91 |
| 2003/0186625 | A1 * | 10/2003 | Nakayama et al. | 451/28 |
| 2004/0051432 | A1 * | 3/2004 | Jiang et al. | 313/311 |
| 2004/0053432 | A1 * | 3/2004 | Liu et al. | 438/40 |
| 2004/0095050 | A1 * | 5/2004 | Liu et al. | 313/309 |
| 2006/0065887 | A1 * | 3/2006 | Tiano et al. | 257/20 |
| 2007/0284987 | A1 | 12/2007 | Liu et al. | |
| 2009/0115306 | A1 * | 5/2009 | Wei et al. | 313/309 |
| 2009/0117674 | A1 * | 5/2009 | Wei et al. | 438/20 |
| 2009/0117808 | A1 * | 5/2009 | Wei et al. | 445/6 |
| 2009/0239072 | A1 * | 9/2009 | Wei et al. | 428/402 |

FOREIGN PATENT DOCUMENTS

| | | | |
|---|---|---|---|
| CN | 1433039 | A | 7/2003 |
| CN | 101042977 | A | 9/2007 |

OTHER PUBLICATIONS

Jiang Kai-Li et al., "Continuous carbon nanotube yarns and their applications",PHYSICS,vol. 32, issue:8, pp. 506-510, 2003.

Fan shou-shan et al., "Explorations on growth mechanism, controlled synthesis and applications of carbon nanotubes", PHYSICS,vol. 35, issue:5, pp. 376-381,2006.

* cited by examiner

*Primary Examiner* — Anne Hines
*Assistant Examiner* — Tracie Green
(74) *Attorney, Agent, or Firm* — Altis Law Group, Inc.

(57) ABSTRACT

A field emission electron source includes a CNT needle and a conductive base. The CNT needle has an end portion and a broken end portion; the end portion is contacted with and electrically connected to a surface of the conductive base. The CNTs at the broken end portion form a taper-shape structure, wherein one CNT protrudes and is higher than the adjacent CNTs.

18 Claims, 15 Drawing Sheets

12

FIELD EMISSION ELECTRON SOURCE HAVING A CARBON NANOTUBE NEEDLE

RELATED APPLICATIONS

This application is related to commonly-assigned applications entitled, "METHOD FOR MANUFACTURING FIELD EMISSION ELECTRON SOURCE HAVING CARBON NANOTUBES", filed Nov. 26, 2008 Ser. No. 12/313,937; "CARBON NANOTUBES NEEDLE AND METHOD FOR MAKING THE SAME", filed Nov. 26, 2008 Ser. No. 12/313,935; "ELECTRON EMISSION APPARATUS", filed Nov. 26, 2008 Ser. No. 12/313,938; "ELECTRON EMISSION APPARATUS AND METHOD FOR MAKING THE SAME", filed Nov. 26, 2008 Ser. No. 12/313,934. The disclosure of the respective above-identified application is incorporated herein by reference.

BACKGROUND

1. Field of the Invention

The invention relates to a field emission electron source employing carbon nanotubes.

2. Discussion of Related Art

Carbon nanotubes (CNTs) produced by means of arc discharge between graphite rods were first discovered and reported in an article by Sumio Iijima, entitled "Helical Microtubules of Graphitic Carbon" (Nature, Vol. 354, Nov. 7, 1991, pp. 56-58). CNTs also feature extremely high electrical conductivity, very small diameters (much less than 100 nanometers), large aspect ratios (i.e. length/diameter ratios greater than 1000), and a tip-surface area near the theoretical limit (the smaller the tip-surface area, the more concentrated the electric field, and the greater the field enhancement factor). These features tend to make CNTs ideal candidates for field emission electron sources.

Generally, a field emission electron source having CNTs includes a conductive base, along with CNTs formed on the conductive base. The CNTs act as an emitter of the field emission electron source. The methods adopted for forming the CNTs on the conductive base mainly include mechanical methods and in situ synthesis methods. The mechanical method is performed by respectively placing a single CNT on a conductive base by an atomic force microscope (AFM), subsequently fixing the CNT on the conductive base by conductive or non-conductive adhesives. However, the controllability of the mechanical method is not as desirable because a single CNT is too small in size. As a result, the single CNT will easily be drawn away from the conductive base due to the electric field force. Otherwise, that would damage the field emission electron source and/or decrease its performance.

The in-situ synthesis method is performed by coating metal catalysts on a conductive base and synthesizing CNTs on the conductive base directly by means of chemical vapor deposition (CVD). However, the mechanical connection between the CNTs and the conductive base generally is relatively weak and, thus, unreliable. In use, such CNTs are also easily drawn away from the conductive base due to the electric field force, which would damage the field emission electron source and/or decrease its performance. Furthermore, the shield effect between adjacent CNTs may reduce the field emission efficiency thereof.

What is needed, therefore, is a field emission source with a high field emission efficiency, along with a controllable method for manufacturing the field emission source.

SUMMARY

In one embodiment, a field emission electron source includes a CNT needle and a conductive base. The CNT needle has an end portion and a broken end portion; the end portion is contacted with and electrically connected to a surface of the conductive base. The CNTs at the broken end portion form a taper-shaped structure, wherein one CNT protrudes and is higher than the adjacent CNTs.

Compared to conventional technologies, the field emission electron source provided by the present method has the following advantages: firstly, the CNT needle having a larger scale than the CNT is used as the electron emitter and, thus, the CNT needle is not easily drawn away from the conductive base due to the electric field force. As a result, the present emission electron source is more substantial. Furthermore, the electric and thermal conductivity, and mechanical strength of the CNT needle are better than the single CNT. As a result, the field emission efficiency of the field emission electron source is improved.

Other advantages and novel features of the present field emission source will become more apparent from the following detailed description of exemplary embodiments when taken in conjunction with the accompanying drawings.

BRIEF DESCRIPTION OF THE DRAWINGS

Many aspects of the present field emission source can be better understood with references to the following drawings. The components in the drawings are not necessarily drawn to scale, the emphasis instead being placed upon clearly illustrating the principles of the present field emission source.

Figure 1:
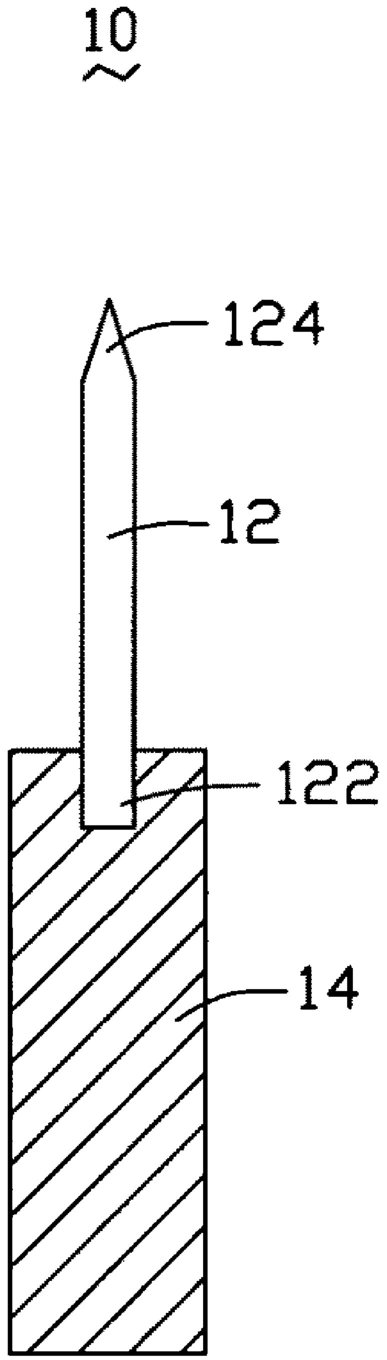
FIG. 1 is a schematic, cross-sectional view, showing a field emission electron source manufactured by the present method.

Corresponding reference characters indicate corresponding parts throughout the several views. The exemplifications set out herein illustrate at least one preferred embodiment of the present method, in one form, and such exemplifications are not to be construed as limiting the scope of the invention in any manner.

DETAILED DESCRIPTION OF EXEMPLARY EMBODIMENTS

References will now be made to the drawings to describe the exemplary embodiments of the present method for manufacturing a field emission electron source, in detail.

Referring to FIG. 1, a field emission electron source 10 includes a CNT needle 12 and a conductive base 14. The CNT needle 12 includes an end portion 122 and a broken end portion 124. The end portion 122 of the CNT needle 12 is in contact with and electrically connected to a surface of the conductive base 14. An angle between a longitudinal axis of the CNT needle 12 with the surface of the conductive base 14 is equal to or greater than 0 degrees and equal to or less than 90 degrees.

Figure 2:
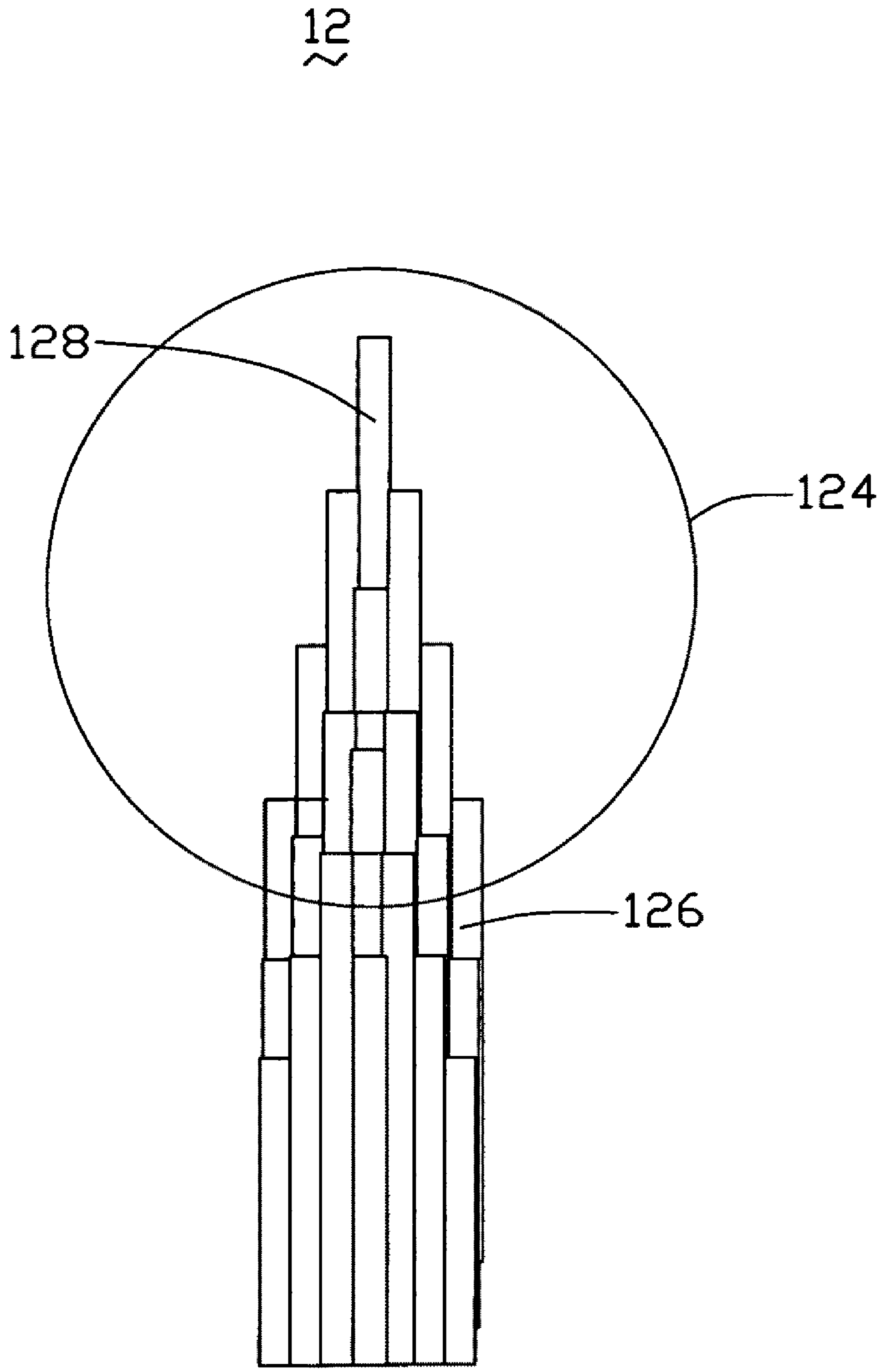
FIG. 2 is a schematic, cross-sectional view, showing a carbon nanotube needle manufactured by the present method.
Figure 3:
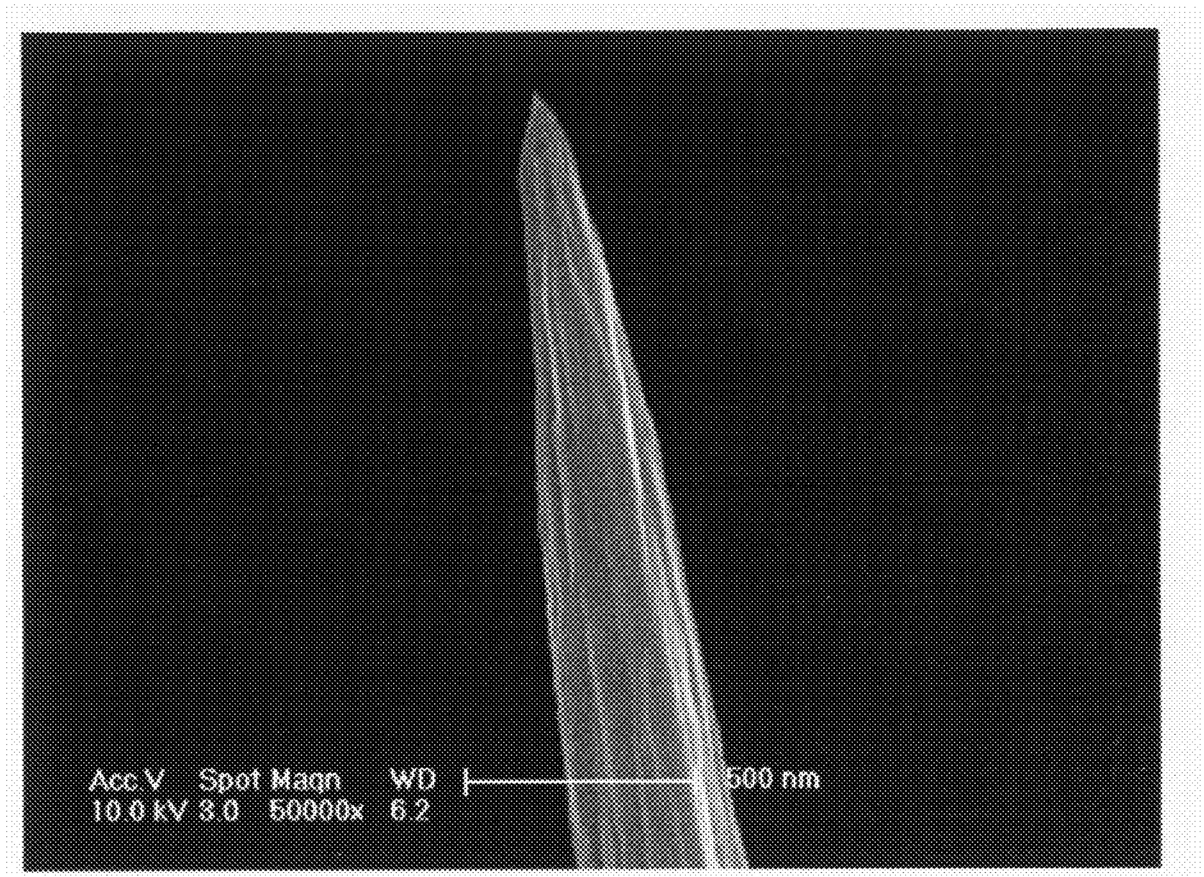
FIG. 3 shows a Scanning Electron Microscope (SEM) image of a carbon nanotube needle manufactured by the present method.
Figure 4:
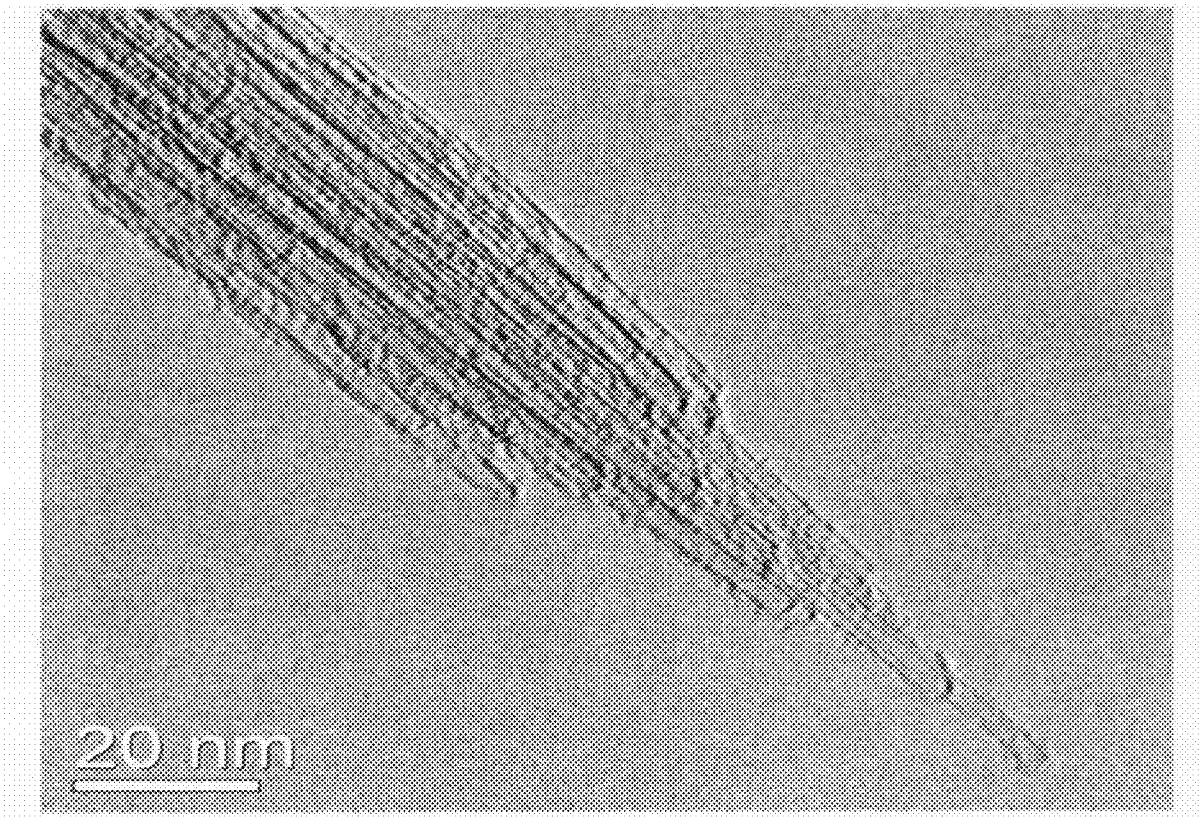
FIG. 4 shows a Transmission Electron Microscope (TEM) image of a carbon nanotube needle manufactured by the present method.

The CNT needle 12 is a CNT bundle. Each carbon nanotube bundle includes a plurality of continuously oriented and substantially parallel carbon nanotubes joined end-to-end by van der Waals attractive force. A diameter of the CNT needle 12 approximately ranges from 1 to 20 microns (μm), and a length thereof ranges from 0.01 to 1 millimeters (mm). Referring to FIGS. 2, 3 and 4, the CNTs at the broken end portion 124 form a similar taper-shaped structure, i.e., one CNT protruding and higher than the adjacent CNTs. The CNTs at the broken end portion 124 have smaller diameters and a fewer number of walls, typically, less than 5 nanometers (nm) in diameter and have about 2-3 walls. However, the CNTs in the CNT needle 12 other than the broken end portion 124 are about 15 nm in diameter and have more than 5 walls. The conductive base 14 is made of an electrically conductive material, such as nickel, copper, tungsten, gold, molybdenum or platinum. The conductive base 14 can also be an insulated base with a conductive film formed thereon.

Figure 5:
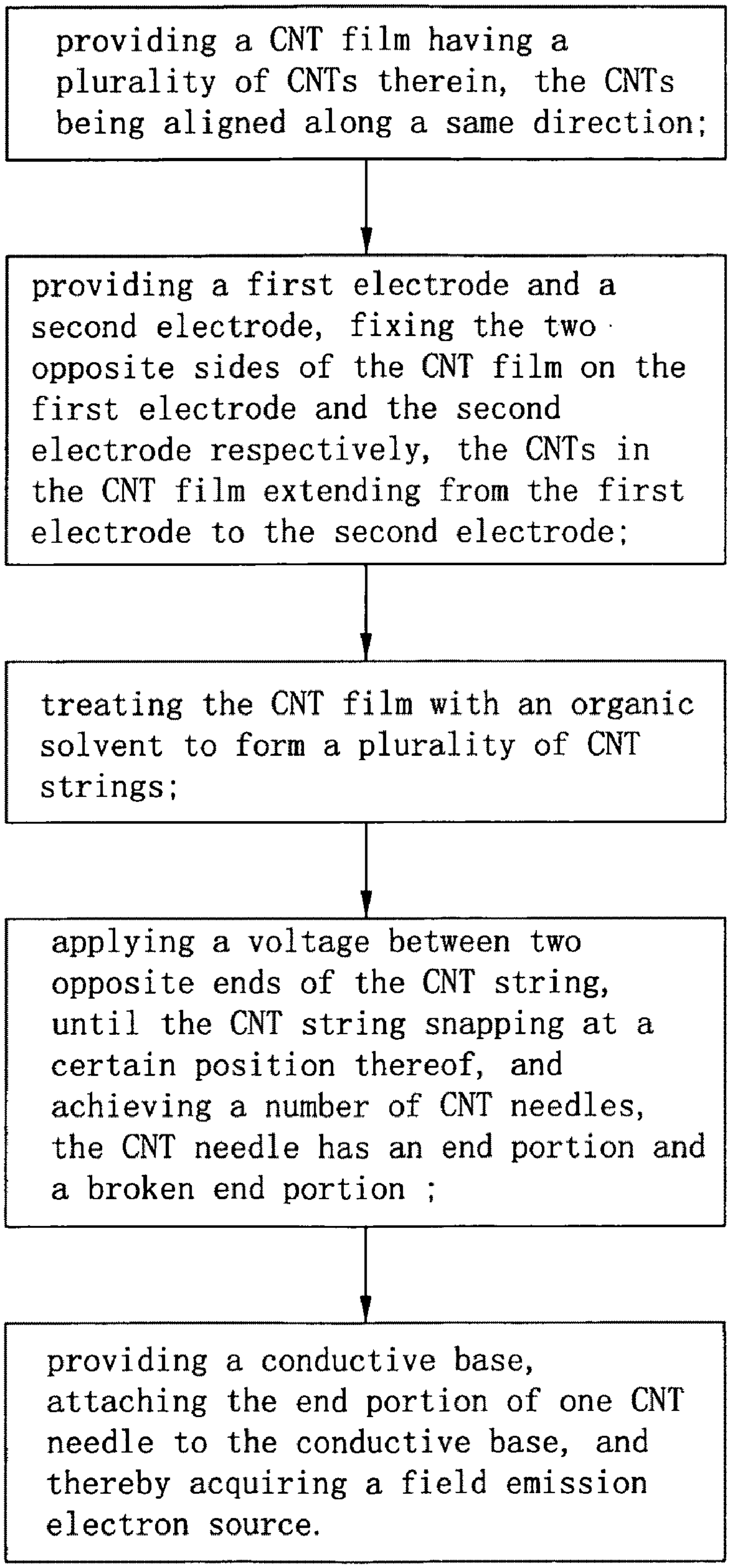
FIG. 5 is a flow chart of a method for manufacturing a field emission source employing CNTs, in accordance with a present embodiment.

Referring to FIG. 5, a method for manufacturing the field emission electron source includes the following steps: (a) providing a CNT film having a plurality of CNTs therein, the CNTs being aligned along a same direction; (b) providing a first electrode and a second electrode, fixing the two opposite sides of the CNT film on the first electrode and the second electrode respectively, the CNTs in the CNT film extending from the first electrode to the second electrode; (c) treating the CNT film with an organic solvent to form a plurality of CNT strings; (d) applying a voltage between two opposite ends of the CNT string via the first electrode and the second electrode, until the CNT string snapping at a certain position thereof, and achieving a number of CNT needles; and (e) providing a conductive base, attaching one CNT needle to the conductive base, and thereby acquiring a field emission electron source.

In step (a), the CNT film is formed by the following substeps: (a1) providing a CNT array; and (a2) drawing CNT segments having a predetermined width from the super-aligned CNTs array at an even/uniform speed to achieve a uniform carbon nanotube film.

In step (a1), initially, a substrate is provided, and the substrate is a P-type silicon or N-type silicon substrate. Secondly, a catalyst layer is deposited on the substrate. The catalyst layer is made of a material selected from a group consisting of iron (Fe), cobalt (Co), nickel (Ni), and their alloys. Thirdly, the substrate with the catalyst layer is annealed at a temperature approximately ranging from 700 to 900 degrees centigrade (° C.) under a protecting gas for approximately 30 minutes to 90 minutes. Fourthly, the substrate with the catalyst layer is heated to a temperature approximately ranging from 500° C. to 740° C. and a mixed gas including a carbon containing gas and a protecting gas is introduced for approximately 5 to 30 minutes to grow a super-aligned CNTs array. The carbon containing gas is a hydrocarbon gas, such as acetylene or ethane. The protecting gas is an inert gas. The grown CNTs are aligned in columns parallel to each other and held together by van der Waals force interactions therebetween. The CNTs array has a high density and each of the CNTs has an essentially uniform diameter.

In step (a2), the CNT segment having a predetermined width includes a plurality of CNTs parallel to each other. The CNT segment is gripped by using an adhesive tape such as the tool to contact the super-aligned array. The pulling direction is substantially perpendicular to the growing direction of the super-aligned array of carbon nanotubes.

In step (b), the first electrode and the second electrode are insulated and separated from each other, a distance between the first electrode and the second electrode ranges from 50 micrometers to 1 millimeter.

Figure 6:
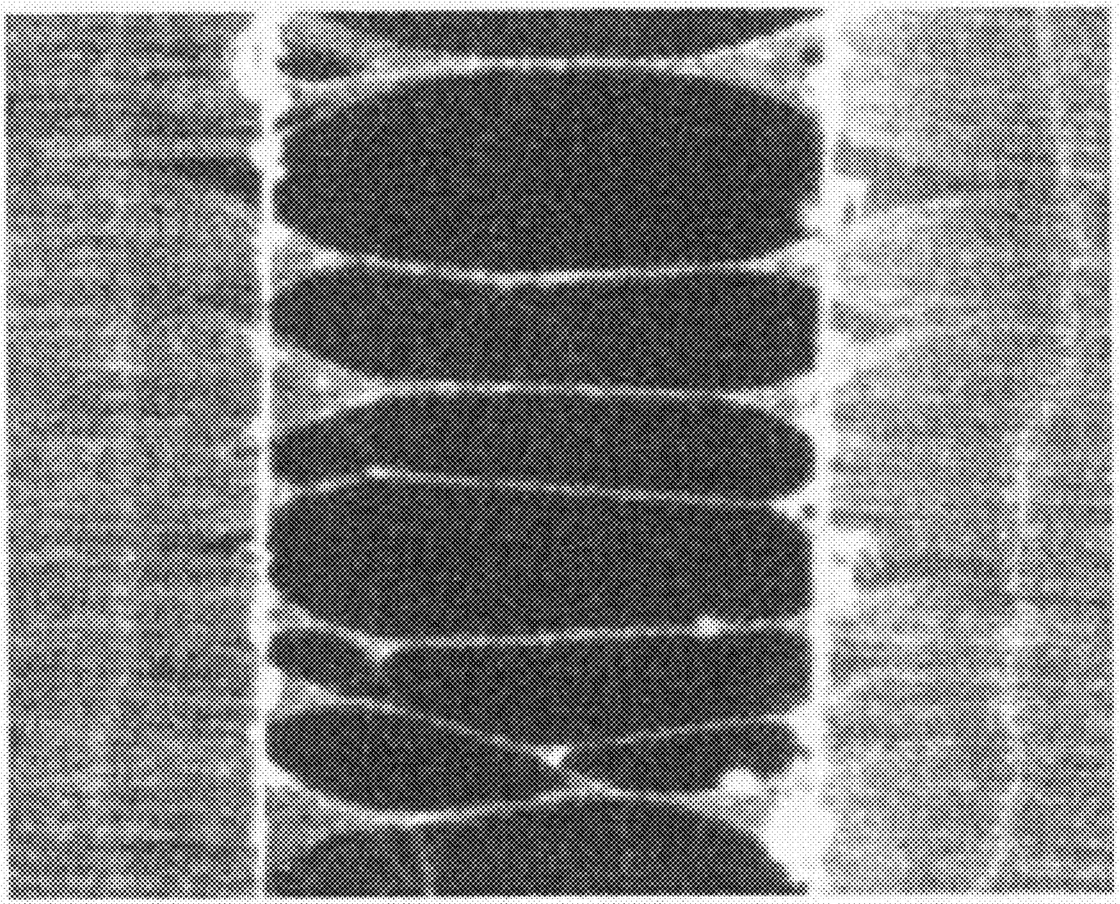
FIG. 6 shows an image of a carbon nanotube film soaked by the organic solvent.

Referring to FIG. 6, step (c) can be executed by dripping the organic solvent onto the CNT film or putting the CNT film with the first electrode and the second electrode in the organic solvent to soak the entire surfaces of the carbon nanotube film. Since the untreated CNT film is composed of a number of the CNTs, the untreated CNT film has a high surface-area-to-volume ratio and, thus, may easily become stuck to other objects. During the surface treatment, the impending CNT film is shrunk into a plurality of CNT strings after the organic solvent is volatilizing, due to factors such as surface tension. The surface area to volume ratio and the diameter of the treated CNT string is reduced. Accordingly, the stickiness of the CNT film is lowered, and strength and toughness of the CNT string is improved. The organic solvent may be a volatilizable organic solvent, such as ethanol, methanol, acetone, dichloroethane, chloroform, or any appropriate mixture thereof.

Figure 7:
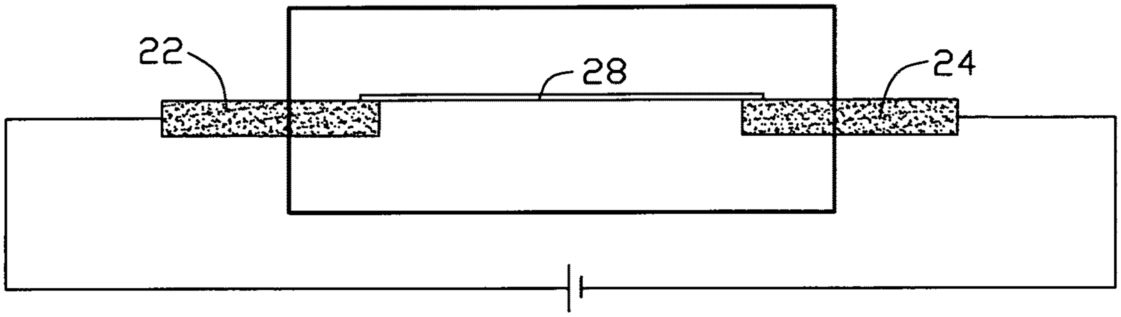
FIG. 7 is a schematic, cross-sectional view, showing the carbon nanotube film of FIG. 6 fusing under a fusing current.
Figure 8:
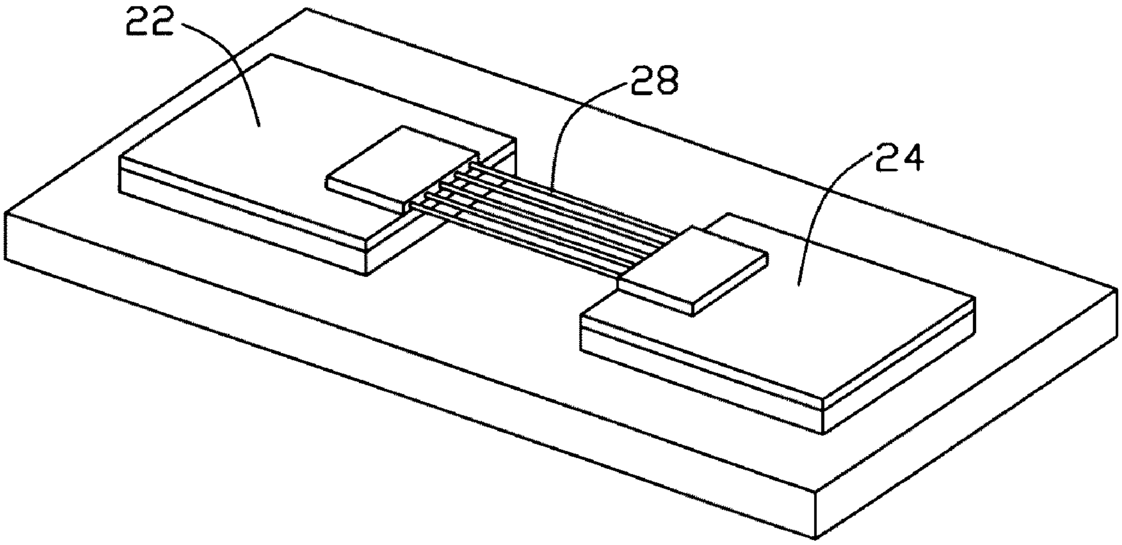
FIG. 8 is a schematic, cross-sectional view, showing a carbon nanotube string.
Figure 9:
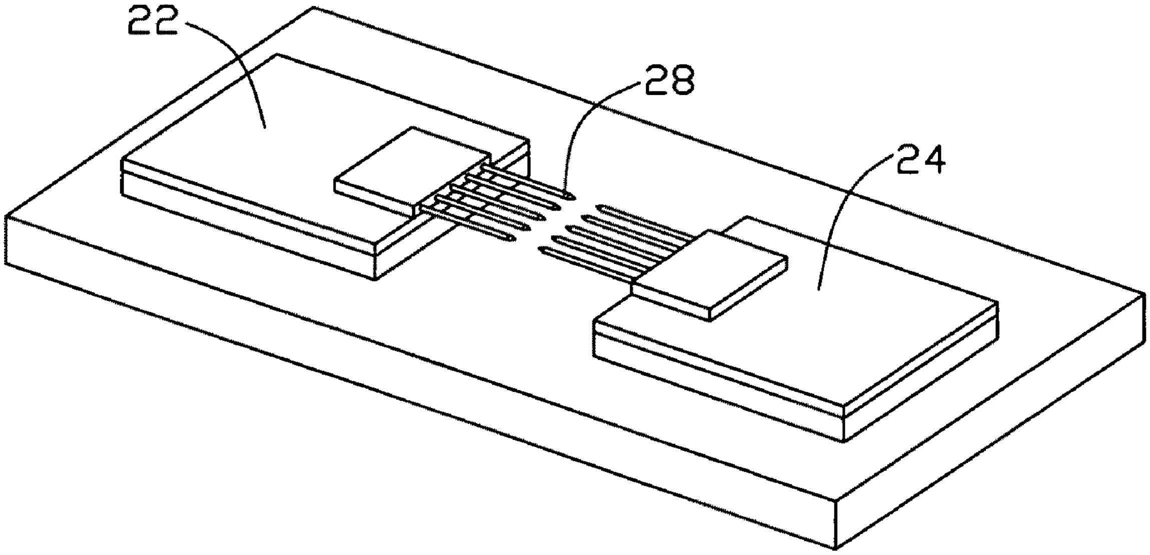
FIG. 9 is a schematic, cross-sectional view, showing the cut carbon nanotube strings.

Referring to FIGS. 7, 8 and 9, the step (d) includes the following sub-steps: (d1) placing the CNT strings, the first electrode 22 and the second electrode 24 connected therewith in a chamber 20; (d2) applying a voltage between two opposite ends of the CNT strings 28 via the first electrode 22 and the second electrode 24 for a period of time to snap the CNT string 28 at a middle point along an axial thereof and, thus, acquiring two snapped CNT needles 12 with a break-end.

In step (d1), the chamber 20 is a vacuum or filled with an inert gas. A diameter of the CNT string 28 approximately ranges from 1 to 20 micrometers, and a length thereof approximately ranges from 0.05 millimeters to 1 millimeter. In the present embodiment, the vacuum chamber 20 is a vacuum and the pressure thereof is lower than $1\times10^{-1}$ Pascal (Pa).

In step (d2), the voltage can be set according to a diameter and/or a length of the CNT strings 28. In the present embodiment, when a length of the CNT string 28 is 300 μm and a diameter thereof is 2 μm, the voltage is 40 voltage (V). A vacuum of the chamber 20 is less than $2\times10^{-5}$ Pascal (Pa). In the present embodiment, a vacuum of the chamber 20 is $2\times10^{-5}$ Pa.

Figure 10:
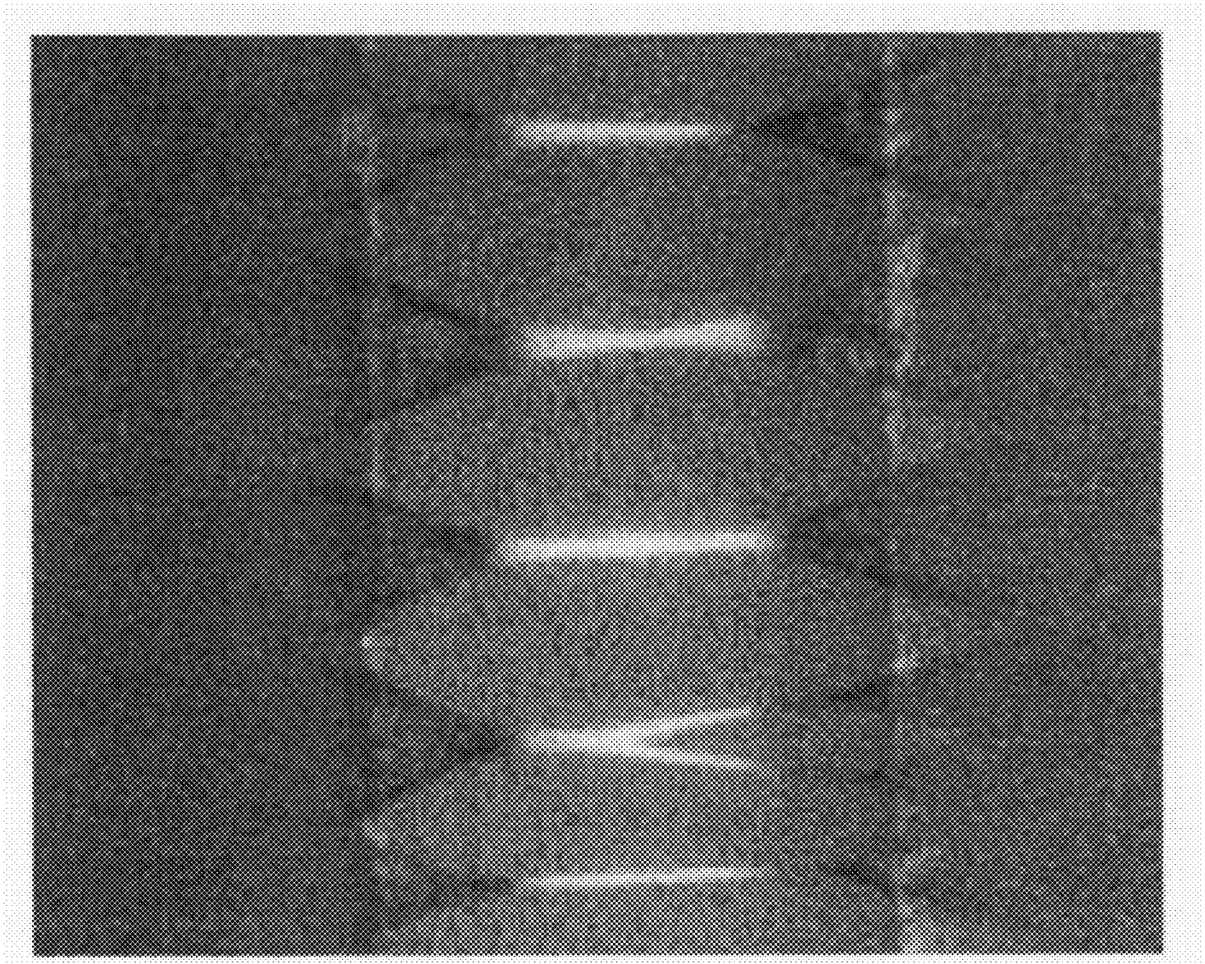
FIG. 10 shows an image of carbon nanotube strings in incandescent state.

Referring to FIG. 10, in step (d2), a temperature of the CNT string 28 increases due to Joule-heating, and the CNT string 28 can reach a temperature approximately ranging from 2000 to 2400 Kelvin (K). When the temperature of the CNT string 28 is high enough, the CNT string 28 is in an incandescent state. Heat in the CNT string 28 is transmitted from the CNT to the electrodes. Since the middle point of the CNT string is furthest from the electrodes, the temperature thereof is highest, and then the CNT string 28 is broken at the middle point. In the present embodiment, after less than 1 hour (h), the CNT string 28 is snapped at the middle point.

Referring to FIG. 9, after the CNT string 28 breaks at the middle point to form two CNT needles 12 on opposite ends to each other. Each CNT needle 12 includes an end portion and an opposite broken end portion. The end portion is fixed on the first electrode or the second electrode. Each CNT needle 12 is composed of well-aligned and firmly compacted CNTs. Referring to FIGS. 2, 3 and 4, the CNTs at the broken end portion 124 have a taper-shaped structure, i.e., one CNT protruding and higher than the adjacent CNTs. That is because during snapping, some carbon atoms vaporize from the CNT string 12. After snapping, a micro-fissure (not labeled) is formed between two break-end portions, the arc discharge may occur between the micro-fissure, and then carbon atoms transform into carbon ions due to ionization. These carbon ions bombard/etch the break-end portions, and then the break-end portion 124 forms the taper-shaped structure.

Figure 11:
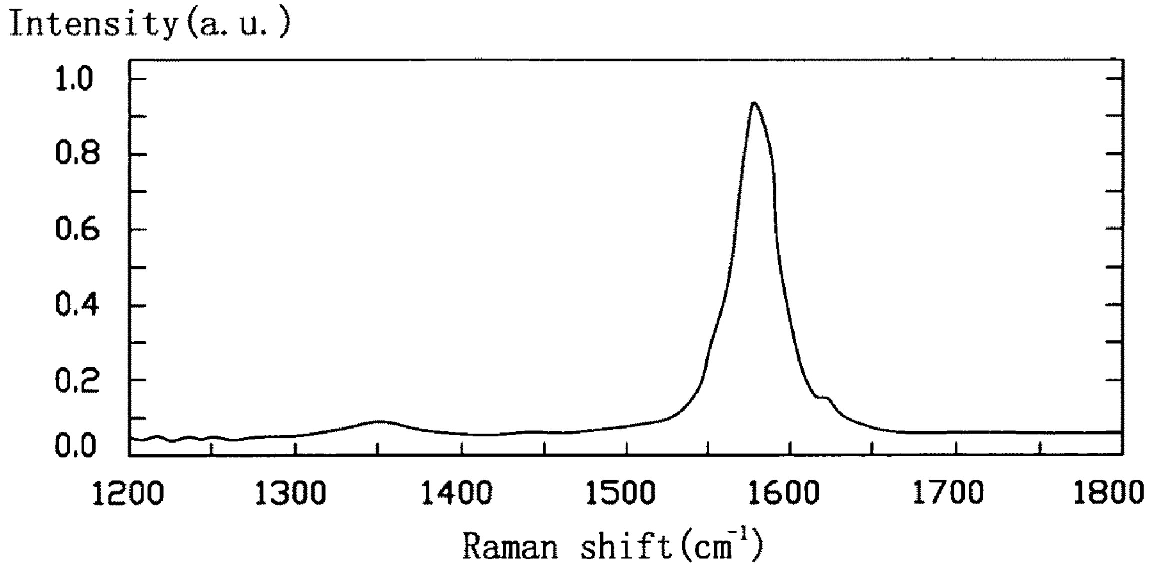
FIG. 11 is a Raman spectrum of the emission tip of the field emission electron source manufactured by the present method.

The CNTs at the broken end portion have smaller diameters and a fewer number of walls, typically, less than 5 nanometers (nm) in diameter and have about 2-3 walls. However, the CNTs in the CNT needle 12 other than the break-end portion are about 15 nm in diameter and more than 5 in wall. It is concluded that the diameter and the number of the walls of the CNTs are decreased in the vacuum breakdown process. A wall-by-wall breakdown of CNTs is due to Joule-heating at a temperature higher than 2000K, with a current decrease process. The high-temperature process can efficiently remove the defects in CNTs and, consequently, improve electric and thermal conductivities and mechanical strength thereof. FIG. 11 shows a Raman spectrum of the break-end portion 124. After snapping, the intensity of D-band (defect mode) at 1580 $cm^{-1}$ is reduced, which indicates the structure effects at the break-end portion 124 are effectively removed.

The CNT needle 12 has improved field emission efficiency, because of good electric and thermal conductivities, and mechanical strength. Moreover, the break-end portion is in the taper-shaped structure. That can prevent the shield effect caused by the adjacent CNTs, consequently, the field emission efficiency of the CNT needle 12 is further improved.

Figure 12:
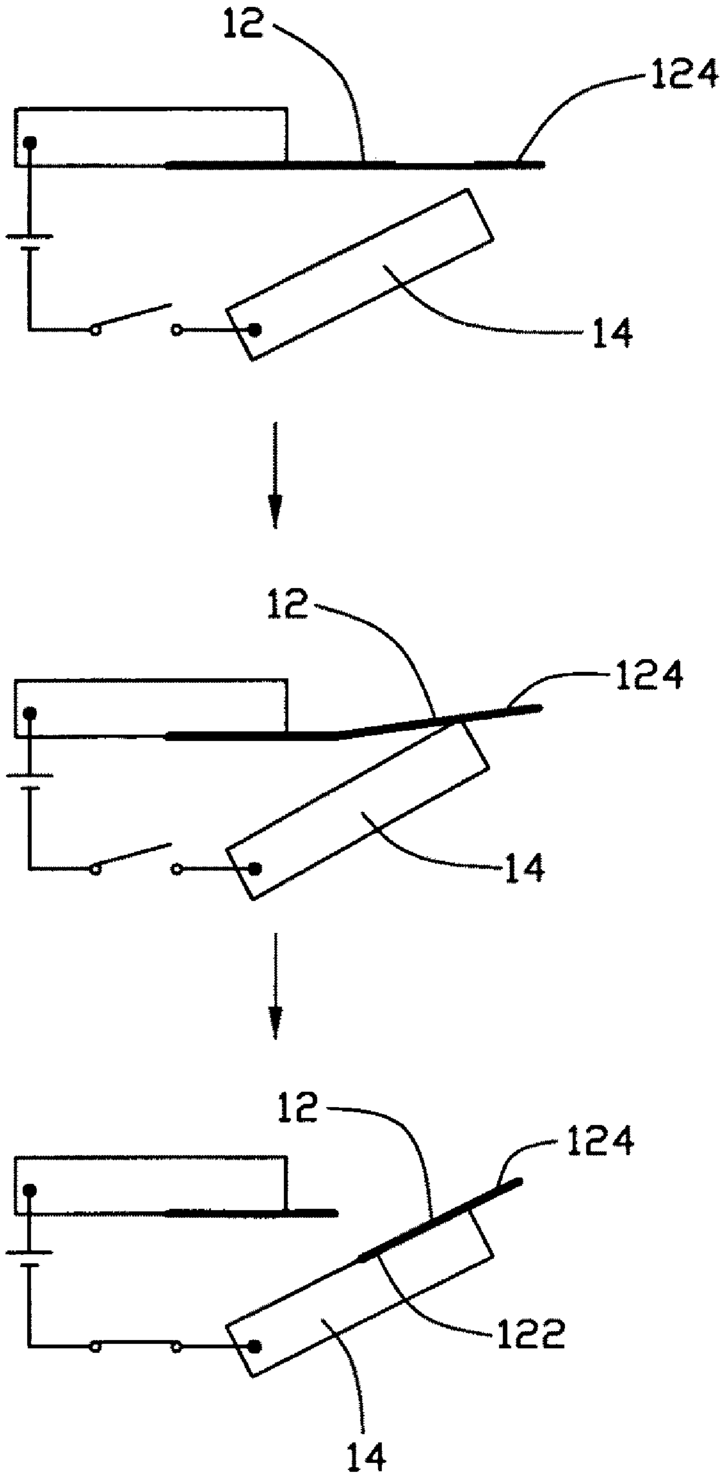
FIG. 12 is a process chart showing the steps of the method for attaching the carbon nanotube needle to the conductive base.

Referring to FIG. 12, Step (e) includes the following sub-steps: (e1) fixing the conductive base 14 on a three-DOF translational machine; (e2) moving the conductive base 14 with the three-DOF translational machine to contact the end portion 122 of the CNT needle 12, bending the CNT needle 12, forming a inflexion in the CNT needle 12; and (e3) applying a voltage between the CNT needle 12 and the conductive base 14 to heat the CNT needle 12, the CNT needle 12 snapping at the inflexion and breaking away from the electrode, subsequently sticking on the conductive base 14.

In step (e1), the three-DOF translational machine can move accurately in the three-DOF, and as a result, the conductive base 14 can move accurately in the three-DOF.

Step (e2) can be executed under a microscope to observe and control the distance between the CNT needle 12 and the conductive base 14 more acutely.

After the CNT needle 12 is attached to the conductive base 14, the field emission electron source 10 is formed. The conductive base 14 is made of an electrically conductive material, such as nickel, copper, tungsten, gold, molybdenum or platinum. The conductive base 14 is an insulated base with a conductive film formed thereon. The size of the CNT needle 12 is so tiny that the CNT needle 12 will be destroyed when a mechanical tool is used to cut the CNT needle 12 directly.

Figure 13:
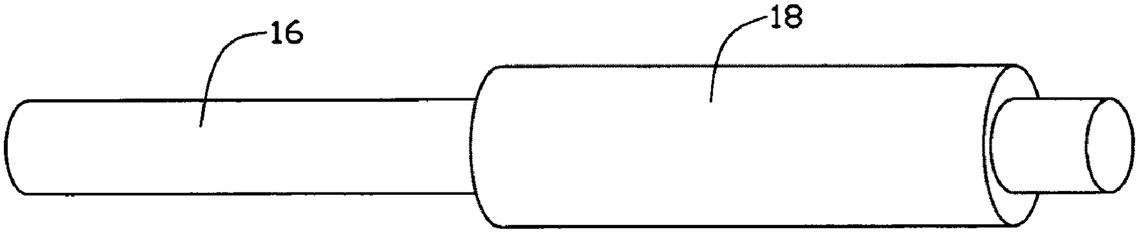
FIG. 13 is a schematic, cross-sectional view, showing an optical fiber with conductive adhesive thereon.
Figure 14:
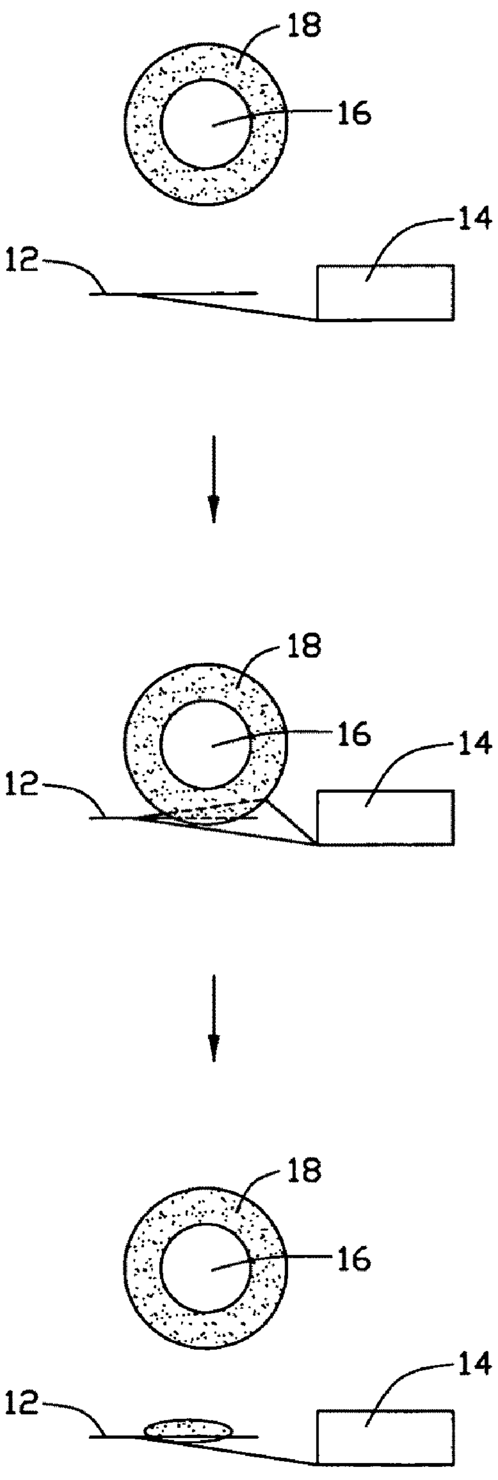
FIG. 14 is a flow chart of a method for fixing the carbon nanotube needle on the conductive base with conductive adhesive.

Referring to FIGS. 13 and 14, the method for manufacturing the field emission electron source can optionally include a step (f). Step (f) includes the following sub-steps: (f1) providing a support 16, coating a layer of conductive adhesive 18 on one end of the support 16; (f2) fixing the other end of the support 16 on a three-DOF translational machine; (f3) moving the support 16 to the field emission electron source 10, adhering the conductive adhesive 14 to the joint of the CNT needle 12 and the conductive base 14; and (f4) drying conductive adhesive 18 on the field emission electron source 10.

In step (f1), The support 16 is a linear structure, a diameter thereof approximately ranges from 50 μm to 200 μm. A thickness of the conductive adhesive 18 approximately ranges from 5 μm to 50 μm. In the present embodiment, the support 16 is a fiber, a diameter of the fiber is 125 μm, a thickness of the lay of conductive adhesive 18 is 125 μm, and the conductive adhesive 18 is a silver paste.

Step (f3) is operated under the microscope. Since the conductive adhesive 14 is a silver paste, and part of the field emission source 10 enters the layer of conductive adhesive, the conductive adhesive 18 is adhered to the joint of the CNT needle 12 and the conductive base 14 when the field emission electron source 10 is moved slowly. As there is intermolecular force between the CNT needle 12 and the conductive base 14, the CNT needle 12 will not depart from the conductive base 14.

Figure 15:
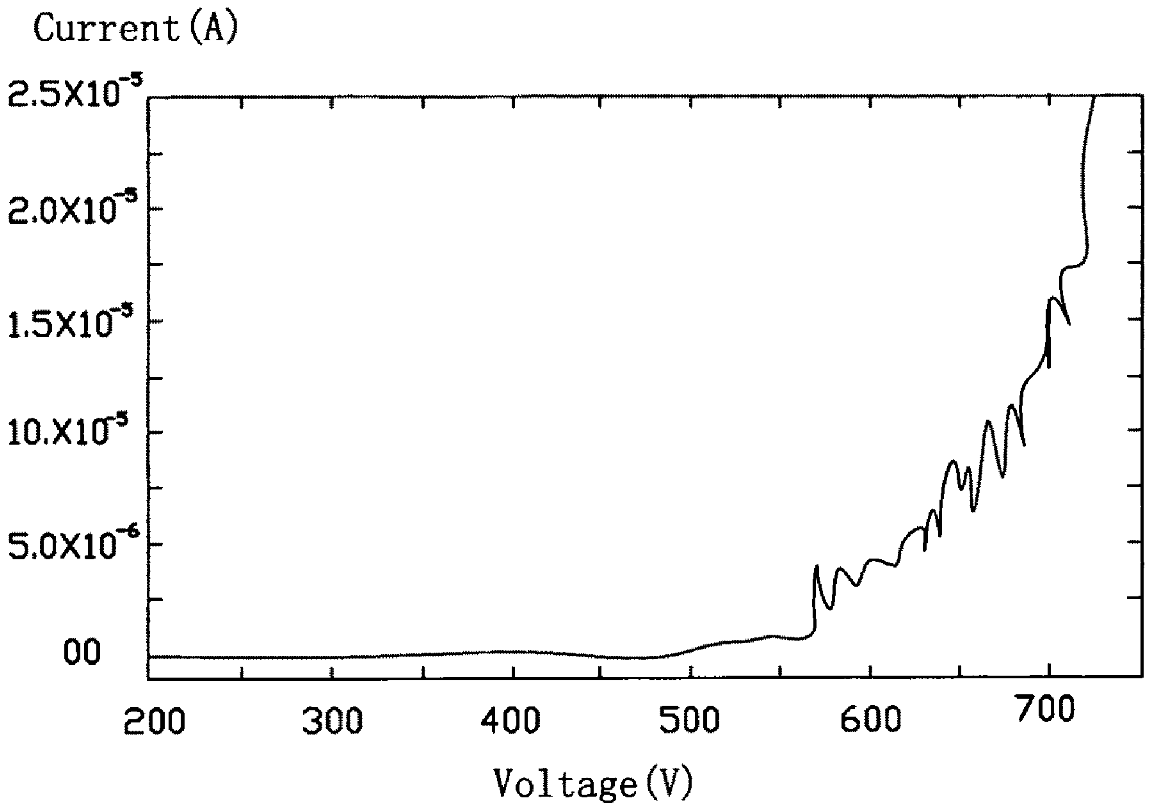
FIG. 15 is a current-voltage graph of the field emission electron source manufactured by the present method.

In step (f4), the organic component in the conductive adhesive 18 is removed, and as the conductive adhesive 18 becomes solid, the CNT needle 12 is firmly fixed on the conductive base 14. FIG. 15 shows an I-V graph of the present field emission electron source 10 made by the method of the present embodiment. A threshold voltage thereof is about 500 V, and an emission current thereof is over 25 μA. A diameter of the break-end portion is about 5 μm and, thus, a current density is calculated over 100 $A/cm^2$.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A field emission electron source comprising:

a conductive base having a surface;

a carbon nanotube (CNT) needle, the CNT needle comprising a plurality of carbon nanotubes and having an end portion and a broken end portion, the end portion being in contact with and electrically connected to the surface of the conductive base, the broken end portion having a single tip CNT protruding from the other carbon nanotubes, wherein a length of the broken end portion monodirectionally decreases from the single tip CNT to an outer periphery of the broken end portion.

2. The field emission electron source as claimed in claim 1, wherein the other CNTs form a tapered-shaped structure about the single tip CNT.

3. The field emission electron source as claimed in claim 1, wherein a diameter of the CNT needle approximately ranges from 1 to 20 microns, and a length thereof approximately ranges from 0.01 to 1 millimeter.

4. The field emission electron source as claimed in claim 1, wherein the CNT needle is a CNT bundle.

5. The field emission electron source as claimed in claim 4, wherein the plurality of CNTs in the CNT bundle continuously oriented and substantially parallel with each other.

6. The field emission electron source as claimed in claim 5, wherein the CNTs are combined to one another by van der Waals attractive force therebetween.

7. The field emission electron source as claimed in claim 1, wherein the broken end portion has a tapered-shaped structure.

8. The field emission electron source as claimed in claim 1, wherein the broken end portion has a diameter of less than 5 nanometers and approximately 2 to 3 walls.

9. The field emission electron source as claimed in claim 1, wherein the broken end portion has a length approximately ranging from 10 to 1000 millimeters.

10. The field emission electron source as claimed in claim 1, wherein the CNT needle and the conductive base are combined by intermolecular force.

11. The field emission electron source as claimed in claim 1, wherein the CNT needle and the conductive base are combined by a conductive adhesive.

12. The field emission electron source as claimed in claim 5, wherein the CNTs in the end portion have a diameter of about 15 nanometers and have more than 5 walls.

13. The field emission electron source as claimed in claim 1, wherein the conductive base comprises a conductive material.

14. The field emission electron source as claimed in claim 13, wherein the conductive material comprises of a conductive film located on an insulated base.

15. The field emission electron source as claimed in claim 13, wherein the conductive material can be selected from the group consisting of nickel, copper, tungsten, gold, molybdenum, and platinum.

16. The field emission electron source as claimed in claim 1, wherein the plurality of carbon nanotubes in the CNT needle are joined end-to-end with each other.

17. The field emission electron source as claimed in claim 1, wherein the single tip CNT is a sharp tip of the CNT needle.

18. The field emission electron source as claimed in claim 1, wherein the single tip CNT is located in a middle of the other carbon nanotubes.

* * * * *